US010396219B2

(12) United States Patent
Herasimenka

(10) Patent No.: US 10,396,219 B2
(45) Date of Patent: Aug. 27, 2019

(54) TRANSPARENT CONDUCTIVE OXIDE IN SILICON HETEROJUNCTION SOLAR CELLS

(71) Applicant: Stanislau Herasimenka, Tempe, AZ (US)

(72) Inventor: Stanislau Herasimenka, Tempe, AZ (US)

(73) Assignee: Arizona Board of Regents on Behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/625,426

(22) Filed: Jun. 16, 2017

(65) Prior Publication Data

US 2017/0365724 A1 Dec. 21, 2017

Related U.S. Application Data

(60) Provisional application No. 62/351,033, filed on Jun. 16, 2016.

(51) Int. Cl.
*H01L 31/18* (2006.01)
*H01L 31/0216* (2014.01)
(Continued)

(52) U.S. Cl.
CPC .................. *H01L 31/02168* (2013.01); *H01L 31/022433* (2013.01); *H01L 31/0747* (2013.01);
(Continued)

(58) Field of Classification Search
CPC .......................... H01L 31/18; H01L 31/02168
See application file for complete search history.

(56) References Cited

U.S. PATENT DOCUMENTS 6,025,585 A * 2/2000 Holland ............ H01L 27/14601 250/208.1
2010/0229927 A1* 9/2010 Yu ....................... H01L 31/0747 136/255

(Continued)

FOREIGN PATENT DOCUMENTS

EP 2669952 B1 3/2015
WO 2016001828 A1 1/2016

OTHER PUBLICATIONS

Einsele, Analysis of sub-stoichiometric hydrogenated silicon oxide films for surface passivation of crystalline silicon solar cells, 2012, Journal of Applied Physics, pp. 54905-1 through 54905-8 (Year: 2012).*

(Continued)

*Primary Examiner* — Bethany L Martin
(74) *Attorney, Agent, or Firm* — Quarles & Brady LLP

(57) ABSTRACT

Devices and methods for reducing optical losses in transparent conductive oxides (TCOs) used in silicon heterojunction (SHJ) solar cells while enhancing series resistance are disclosed herein. In particular, the methods include reducing the thickness of TCO layers by about 200% to 300% and depositing hydrogenated dielectric layers on top to form double layers of antireflection coating. It has been discovered that the conductivity of a thin TCO layer can be increased through a hydrogen treatment supplied from the capping dielectric during the post deposition annealing. The optimized cells with ITO/$SiO_x$:H stacks achieved more than 41 mA/cm$^2$ generation current on 120-micron-thick wafers while having approximately 100 Ohm/square sheet resistance. Further, solar cells and methods may include integration of ITO/$SiO_x$:H stacks with Cu plating and use ITO/$SiN_x$/$SiO_x$ triple layer antireflection coatings. The (Continued)

experimental data details the improved optics and resistance in cell stacks with varying materials and thicknesses.

10 Claims, 5 Drawing Sheets

(51) Int. Cl.
*H01L 31/0224* (2006.01)
*H01L 31/0747* (2012.01)
*H01L 31/20* (2006.01)

(52) U.S. Cl.
CPC .......... *H01L 31/202* (2013.01); *H01L 31/208* (2013.01); *Y02E 10/50* (2013.01); *Y02P 70/521* (2015.11)

(56) References Cited

U.S. PATENT DOCUMENTS

| | | | | |
|---|---|---|---|---|
| 2011/0061732 | A1* | 3/2011 | Yang | H01L 31/02167 136/258 |
| 2011/0308608 | A1* | 12/2011 | Shim | H01L 31/02168 136/258 |
| 2012/0318336 | A1 | 12/2012 | Hekmatshoar-Tabari et al. | |
| 2013/0180578 | A1 | 7/2013 | Ravi | |
| 2014/0116507 | A1* | 5/2014 | Shim | H01L 31/02168 136/256 |
| 2014/0231781 | A1* | 8/2014 | Imai | H01L 51/448 257/40 |

OTHER PUBLICATIONS

S. De Wolf, A. Descoeudres, Z.C. Holman, C. Ballif, High-efficiency silicon heterojunction solar cells: a review, Green 2 (2012) 7-24.

Z.C. Holman, A. Descoeudres, L. Barraud, F.Z. Fernandez, J.P. Seif, S. De Wolf, et al., Current Losses at the Front of Silicon Heterojunction Solar Cells, IEEE Journal of Photovoltaics. 2 (2012) 7-15. doi:10.1109/JPHOTOV.2011.2174967.

Z.C. Holman, M. Filipiè, A. Descoeudres, S. Dewolf, F. Smole, M. Topiè, C. Ballif, Infrared light management in high-efficiency silicon heterojunction and rear-passivated solar cells, J. Appl. Phys. 113 (2013) 013107, 13 pages.

M. Bivour, S. Schröer, M. Hermle, Numerical Analysis of Electrical TCO / a-Si:H(p) Contact Properties for Silicon Heterojunction Solar Cells, Energy Procedia. 38 (2013) 658-669. doi:10.1016/j.egypro.2013.07.330.

B. Demaurex, S. Dewolf, A. Descoeudres, Z.C. Holman, C. Ballif, Damage at hydrogenated amorphous/ crystalline silicon interfaces by indium tin oxide overlayer sputtering, Appl. Phys. Lett. 101 (2012) 171604, 4 pages.

A. Tomasi, F. Sahli, J.P. Seif, L. Fanni, S.M. De N. Agut, J. Geissbuhler, et al., Transparent Electrodes in Silicon Heterojunction Solar Cells: Influence on Contact Passivation, IEEE Journal of Photovoltaics. 6 (2016) 17-27. doi:10.1109/JPHOTOV.2015.2484962.

D. Zhang, I.A. Digdaya, R. Santbergen, R.A.C.M.M. Van Swaaij, P. Bronsveld, M. Zeman, et al., Design and fabrication of a SiOx/ITO double-layer anti-reflective coating for heterojunction silicon solar cells, Solar Energy Materials and Solar Cells. 117 (2013) 132-138. doi:10.1016/j.solmat.2013.05.044.

K.-U. Ritzau, T. Behrendt, D. Palaferri, M. Bivour, M. Hermle, Hydrogen doping of Indium Tin Oxide due to thermal treatment of hetero-junction solar cells, Thin Solid Films. 599 (2016) 161-165. doi:10.1016/j.tsf.2015.12.027.

L. Barraud, Z.C. Holman, N. Badel, P. Reiss, A. Descoeudres, C. Battaglia, et al., Hydrogen-doped indium oxide/indium tin oxide bilayers for high-efficiency silicon heterojunction solar cells, Solar Energy Materials and Solar Cells. 115 (2013) 151-156. doi:10.1016/j.solmat.2013.03.024.

E. Kobayashi, Y. Watabe, T. Yamamoto, Y. Yamada, Cerium oxide and hydrogen co-doped indium oxide films for high-efficiency silicon heterojunction solar cells, Solar Energy Materials and Solar Cells. 149 (2016) 75-80. doi:10.1016/j.solmat.2016.01.005.

S. Herasimenka, B. Dauksher, C. Tracy, K. Ghosh, V. Sharma, M. Bailly, S. Bowden, Surface Peparation and Optimization of Amorphous Silicon Deposition for Silicon Heterojunction Solar Cells, Proceedings of the 28th European Photovoltaic Solar Energy Conference (2013) pp. 1943-1946.

S.Y. Herasimenka, W.J. Dauksher, C.J. Tracy, J. Lee, A. Augusto, H. Jain, K. Tyler, Z. Kiefer, P. Balaji, S. Bowden, C. Honsberg, Front- and Rear-Emitter Screen Printed Silicon Heterojunction Solar Cells with >20% Efficiency, Proceedings of the 31st European Photovoltaic Solar Energy Conference (2015) pp. 761-764.

K.R. McIntosh, S.C. Baker-Finch, OPAL 2: Rapid optical simulation of silicon solar cells, in: 2012 38th IEEE Photovoltaic Specialists Conference (PVSC), 2012: pp. 000265-000271. doi:10.1109/PVSC.2012.6317616.

M. Bivour, S. Schröer, M. Hermle, S.W. Glunz, Silicon heterojunction rear emitter solar cells: Less restrictions on the optoelectrical properties of front side TCOs, Solar Energy Materials and Solar Cells. 122 (2014) 120-129. doi:10.1016/j.solmat.2013.11.029.

E.O. Ateto, M. Konagai, and S. Miyajima, Triple Layer Antireflection Design Concept for the Front Side of c-Si Heterojunction Solar Cell Based on the Antireflective Effect of nc-3C-SiC:H Emitter Layer, International Journal of Photoenergy, vol. 2016, Article ID 5282851, 9 pages, 2016. doi:10.1155/2016/5282851.

V. Sharma, A. Bailey, B. Dauksher, C. Tracy and S. Bowden, Characterization and Comparison of Silicon Nitride Films Deposited Using Two Novel Processes, J. Vac. Sci. Technol. A 30(2), Mar./Apr. 2012, 021201, 6 pages.

* cited by examiner

TRANSPARENT CONDUCTIVE OXIDE IN SILICON HETEROJUNCTION SOLAR CELLS

CROSS REFERENCES TO RELATED APPLICATIONS

This application claims priority to U.S. Patent Application No. 62/351,033 filed Jun. 16, 2016.

STATEMENT REGARDING FEDERALLY SPONSORED RESEARCH

Not Applicable.

BACKGROUND OF INVENTION

In the technical field of solar cells, silicon heterojunction technology can achieve very high efficiencies and has the potential to provide lower production costs in high volume manufacturing. In order to lower the costs and carbon output caused by fossil fuels in energy generation, attempts have been made to convert the production of energy to cleaner, cheaper alternative energy sources, such as solar power.

A solar cell uses the principles of photoelectricity to convert energy within the sun's light into electricity. The various types of solar cells may include differing p- and n-junctions, such as cells with single or multiple junctions. In solar cells with a single p-n junction, the stacks of p-doped and n-doped layers made of similar materials with equal band gaps are said to form a homojunction solar cell. Single-junction stacks with at least two layers of varying band gap material are called heterojunction solar cells.

When sunlight hits a solar cell, light absorbed near the p-n junction generates carriers. The electric field across the junction separates the carriers that have diffused into the p-n junction and in turn, produces an electric current in the solar cell which may be transferred to attached devices. The quality of a solar cell is measured by the energy conversion efficiency, i.e., the ratio between the converted power from the sunlight and the transferred power to an electrical circuit.

Silicon heterojunction (SHJ) solar cells can achieve higher efficiencies than homojunction cells because of an inherent band gap between an emitter layer of amorphous silicon (a-Si) and a base layer of crystalline silicon (c-Si) that acts as a barrier for minority carriers to reduce the recombination velocity at the cell surface otherwise seen in homojunction cells with dangling bonds. The thinner a-Si layer in a heterojunction solar cell can passivate the surface of the c-Si base layer by repairing these dangling bonds and thus, maintaining the higher efficiency of the stack as compared with the homojunction solar cell. For these reasons, SHJ solar cells may provide greater efficiencies with higher open-circuit voltage ($V_{OC}$) and larger short-circuit current ($J_{SC}$).

In current SHJ cells, doped a-Si films are deposited in layers on both sides of the base layer (or wafer) to form p- and n-type carrier collectors. Usually a transparent conductive oxide (TCO) layer is formed on top of the doped a-Si films to achieve lateral conductivity and good ohmic contact with metal electrodes. On the front (or top) sides of cells, TCO layers also serve as an antireflective coating, while at the rear (or back) side, TCO layers can be optimized in conjunction with a corresponding metal layer to form an infrared reflector.

Optimization of TCO layers in SHJ solar cells is a subject of multiple tradeoffs between optical, recombination, and series resistance gains and losses. The generally desired TCO properties include, but are not limited to: (1) a refractive index close to 2.0 for serving as an antireflective coating in front of the silicon wafer; (2) transparency in the entire 'silicon solar' range (from about 350 to 1200 nm) for the front layer, transparency from approximately 800 to 1200 nm for avoiding parasitic absorption of infrared (IR) light for the rear layer; (3) a necessary lateral conductivity for front layers usually in the range of about 50 to 100 Ω/□, which is determined by the front grid design; (4) good ohmic contact with the corresponding metal electrodes and doped a-Si films for forming Schottky barriers; (5) deposition without damage to the underlying a-Si film and without inducing change in the a-Si/crystalline Si (c-Si) heterojunction, which could limit the performance of the SHJ solar cell; and (6) an absence of reliability issues for preventing degradation and failures in the field.

It is often the case that material properties favorable for certain design requirements are harmful to the others. As a result of the tradeoffs between the listed requirements, most SHJ cells (including record cells) usually have lower $J_{SC}$ compared to diffused junction cells (for most reported cells <40 mA/cm$^2$) with a characteristic low response for the external quantum efficiency (EQE) in 350-600 nm range. These lower values are partly due to absorption in the a-Si top layers, but also due to the absorption in the front TCO antireflective coating layers. Additionally, if not optimized, the rear TCO/metal layer stack can cause significant absorption in the IR portion of the spectrum leading to additional $J_{SC}$ losses.

Therefore, a system and method for optimizing the design of Si heterojunction solar cell layer stacks, such that optical response is increased and operation is enhanced, that will not include significant losses in resistance and other properties at a low cost of production and that will alleviate other identified issues, is highly desirable.

SUMMARY OF THE INVENTION

The present disclosure provides devices and methods for reducing optical losses in transparent conductive oxides (TCOs) used in silicon heterojunction solar cells while enhancing series resistance. In particular, the methods include reducing the thickness of TCO layers by about 200% to 300% and depositing hydrogenated dielectric layers on top to form dual layers of antireflective coating. It has been discovered that the conductivity of a thin TCO antireflective coating layer can be increased through a hydrogen treatment supplied from the capping dielectric layer during post deposition annealing. In the experiments detailed below, optimized cells with indium tin oxide and hydrogenated Si oxide (ITO/$SiO_x$:H) stacks achieved more than 41 mA/cm$^2$ generation current on 120-micron-thick wafers while having approximately 100 Ohm/square sheet resistance. Further disclosed are solar cells and methods that include integration of ITO/$SiO_x$:H stacks with Cu plating and use ITO/$SiN_x$/$SiO_x$ triple layer antireflection coatings. The experimental data details the improved optics and resistance in cell stacks with varying materials and thicknesses.

Previous solar cell stacks have included layers of a base, emitter, and antireflective coating. In the present disclosure, systems and methods for improving the optical response in Si heterojunction solar cells has been discovered. In particular, using a combination of two antireflective coating layers on top of the base and emitter layers where one is a transparent conducting oxide and the other is a hydrogenated Si oxide increases conductivity in the transparent conducting oxide layer through the transfer of hydrogen from the Si oxide layer. Thus, using ITO/$SiO_x$:H stacks in SHJ cells may improve the optical response. The present disclosure provides methods of improving conductivity in the transparent conducting oxide antireflective coating layer through hydrogen treatment supplied from plasma-enhanced vapor deposition (PECVD) films. The experimental data included herein show that SHJ cells with ITO/$SiO_x$:H stacks advantageously achieved 41.3 mA/$cm^2$ generation currents and 40.6 mA/$cm^2$ short circuit currents. Additionally provide herein are systems and methods for optimizing the integration of ITO/$SiO_x$:H stacks with Cu plating.

According to one aspect, a solar cell includes a silicon base layer, an emitter layer, a first antireflective coating layer, and a second antireflective coating layer. The emitter layer is disposed on a first side of the silicon base layer and comprises amorphous silicon. The first antireflective coating layer is disposed on the emitter layer and comprises a transparent conducting oxide. The second antireflective coating layer is disposed on the first antireflective coating layer. The second antireflective coating layer comprises a hydrogenated silicon oxide.

According to another aspect of the solar cell, the first antireflective coating layer is hydrogenated by the second antireflective coating layer after annealing such that conductivity of the first antireflective coating layer is increased.

According to a further aspect of the solar cell, the conductivity of the first antireflective coating layer is increased by about 20% to about 40%.

According to yet another aspect of the solar cell, the second antireflective coating layer has an atomic percentage of hydrogen between about 10% and about 40%.

According to a further aspect of the solar cell, the atomic percentage of hydrogen of the second antireflective coating layer is about 25%.

According to another aspect, the solar cell further includes a conducting grid disposed on the second antireflective coating layer.

According to a further aspect of the solar cell, the conducting grid comprises at least one of silver, copper, and nickel.

According to yet another aspect of the solar cell, the silicon base layer includes a crystalline-Si substrate.

According to a further aspect of the solar cell, the silicon base layer includes an epitaxially formed crystalline-Si thin film.

According to another aspect, a method for fabricating a solar cell is provided. The method includes preparing a silicon base layer. An emitter layer is deposited on a first surface the Si base layer. The emitter layer comprises an amorphous silicon. A first antireflective coating layer is deposited on the emitter layer. The first antireflective coating layer comprises a transparent conducting oxide. A second antireflective coating layer is deposited on the first antireflective coating layer. The second antireflective coating layer comprises a hydrogenated silicon oxide.

According to another aspect of the method, the solar cell is annealed such that the first antireflective coating layer is hydrogenated by the second antireflective coating layer thereby increasing conductivity of the first antireflective coating layer.

According to a further aspect of the method, the conductivity of the first antireflective coating layer is increased by about 20% to about 40%.

According to yet another aspect of the method, the second antireflective coating layer has an atomic percentage of hydrogen between about 10% and about 40%.

According to a further aspect of the method, the atomic percentage of hydrogen of the second antireflective coating layer is about 25%.

According to another aspect of the method, a conducting grid is deposited on the second antireflective coating layer.

According to a further aspect of the method, the conducting grid comprises at least one of silver, copper, and nickel.

According to yet another aspect of the method, the silicon base layer includes a crystalline-silicon substrate.

According to a further aspect of the method, the silicon base layer includes an epitaxially formed crystalline-silicon thin film.

The foregoing and other objects and advantages of the present disclosure will appear from the following detailed description. In the detailed description, reference is made to the accompanying drawings which illustrate an embodiment of the invention.

DETAILED DESCRIPTION

The present disclosure provides systems and methods for enhancing the performance of Si heterojunction (SHJ) solar cells. Further, the disclosure provides methods for improving the optical response of SHJ solar cells through the use of hydrogenated Si oxide ($SiO_x$:H) layers adjacent to transparent conducting oxide (TCO) layers to allow for hydrogen transfer between the antireflective coating layers, thereby increasing the conductivity of the transparent conducting oxide layer.

Figure 1:
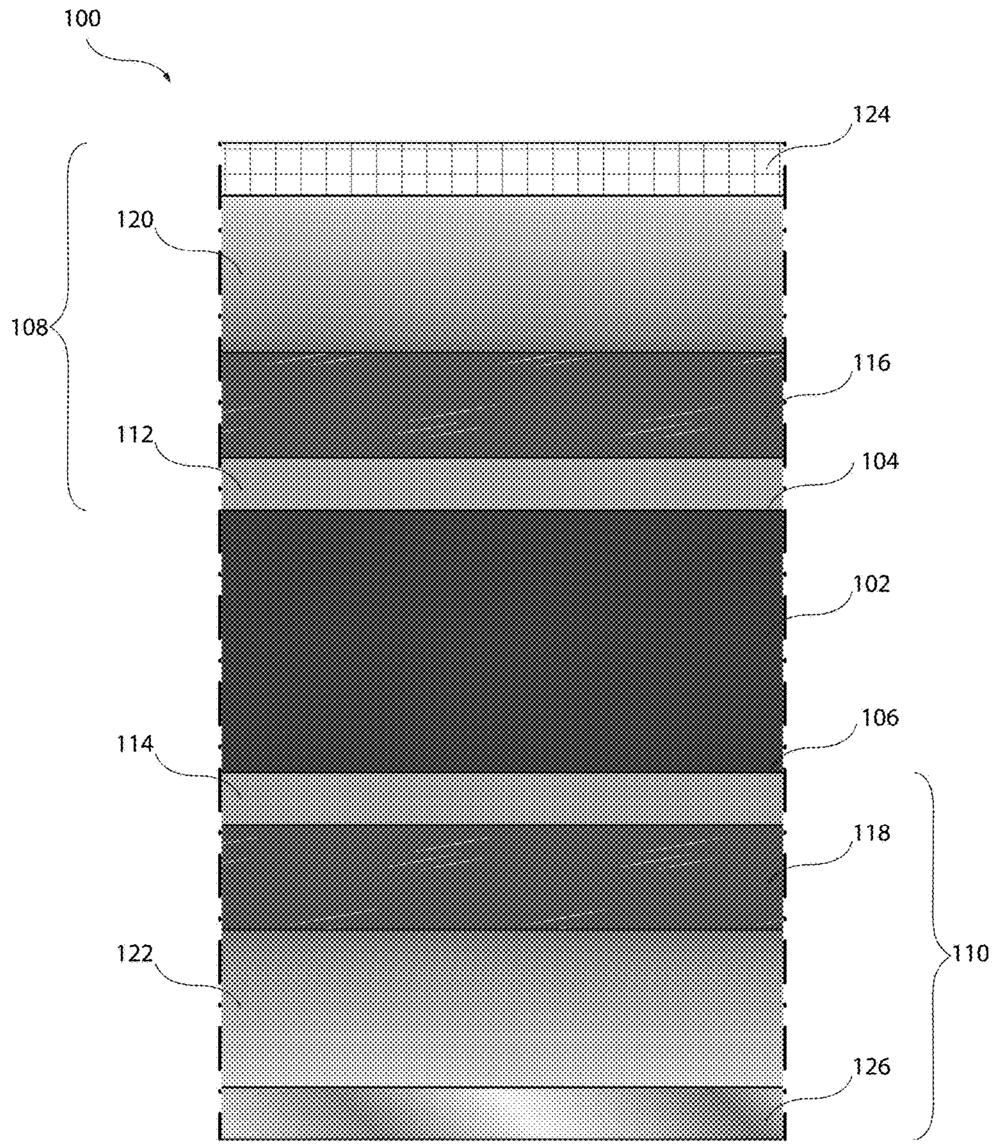
FIG. 1 is a representation of one example of a layer stack of a Si heterojunction solar cell, in accordance with the present disclosure.

As shown in FIG. 1, a SHJ solar cell stack 100 comprises a silicon base layer 102 at the center of the SHJ solar cell stack 100. The silicon base layer 102 includes a first surface 104 and a second surface 106 and may be made of crystalline Si (c-Si) or any other suitable substrate, such as n-type Czochralski (CZ) silicon wafer, for example. Top (or front) layers 108 are disposed on the first surface 104 of the silicon base layer 102. Rear (or bottom) layers 110 are disposed on the second surface 106 of the silicon base layer 102. The top layers 108 absorb incident sunlight shining upon the SHJ solar cell stack 100 and may include antireflective layers to increase any absorption occurring therethrough. The rear layers 110 may include rear mirrors to reflect the sunlight back toward the junction. Adjacent the first surface 104 of the Silicon base layer 102, a first emitter layer 112 may be disposed. A second emitter layer 114 may be disposed on the silicon base layer 102 adjacent the second surface 106. The first and second emitter layers 112, 114 may be made of amorphous Si (a-Si) or any other suitable material for forming the heterojunction of the solar cell. As, depicted in FIG. 1, on top of and below the first and second emitter layers 112, 114, first and second antireflective coating layers 116, 118 may be deposited. The first and second antireflective coating layers 116, 118 may be a transparent conductive oxide (TCO) material, such as indium tin oxide (ITO), GaInO (GIO), GaInSnO (GITO), ZnInO (ZIO), and/or ZnInSnO (ZITO). It is also contemplated that the first and second antireflective coating layers 116, 118 may be different thicknesses and may be optimized to provide different responses to impingent photons. It is also contemplated that the first and second antireflective coating layers 116, 118 may be doped with different materials or may be different materials.

Third and fourth antireflective coating layers 120, 122, respectively, may be deposited onto outer surfaces of first and second antireflective coating layers 116, 118 on either side of the SHJ solar cell stack 100. The third and fourth antireflective coating layers 120, 122 may comprise a hydrogenated Silicon oxide ($SiO_x$:H) layer. Alternatively, the third and fourth antireflective coating layers 120, 122 may comprise other suitable hydrogenated dielectric materials. After deposition of the all of the antireflective coating layers, the SHJ solar cell stack 100 may then be annealed. Advantageously, the annealing process may cause hydrogen from the third and fourth antireflective coating layers 120, 122 (i.e., hydrogenated dielectric layers) 120,122 to diffuse into the TCO of the first and second antireflective coating layers 116, 118. This hydrogenation of the TCO layers provided in the systems and methods disclosed herein provides the SHJ solar cell stack 100 with enhanced properties, such as increased conductivity, optical response, and efficiency. Further details of this beneficial discovery are described below and in the experiments section.

The method may include preparing ITO/$SiO_x$:H stacks on the front and on the rear sides of a SHJ cell to reduce optical losses without compromising with series resistance or recombination. This structure is advantageous because $SiO_x$:H on the front may serve as a second antireflection coating to allow thinner TCO absorbing less light. At the same time, conductivity of a thin TCO can be maintained at a sufficient level due to the effect of hydrogen treatment, where hydrogen is supplied from $SiO_x$:H layer during post-deposition annealing. At the rear side thin-ITO/$SiO_x$:H/Ag stack may be a superior rear mirror when compared to a conventional thick-TCO/Ag stack with less parasitic absorption in 800-1200 nm range.

The effect of hydrogen doping of ITO from hydrogenated plasma-enhanced vapor deposition (PECVD) films was recently reported by Ritzau et al., where the observed increase of ITO conductivity during a post deposition annealing in a standard SHJ cell was attributed to hydrogen effusion from underlying a-Si films. Hydrogen was also reported to promote crystallinity of certain TCOs, such as indium oxide (IO) and indium cerium oxide (ICO), for example, if supplied to the chamber during their deposition. Thus, it has been discovered that hydrogen treatment of post deposited ITO films not only increases free carrier density, but also may improve mobility.

Finally, the SHJ solar cell stack 100 of FIG. 1 may include a conductive grid 124 deposited on the top outer surface of third antireflective coating layer 120. This conductive grid 124 may be made of any conductive material such as Ag, Cu, and/or Ni, for example. At the bottom of the SHJ solar cell stack 100, there may be included a rear contact 126. This rear contact 126 may provide a conductive material for transferring electricity from the SHJ solar cell stack 100 after conversion from light. The rear or bottom layers 110 in the SHJ solar cell stack 100 may all act as rear mirrors for the solar cell. Thus, in one aspect, the present disclosure provides a system and method for enhanced operation of a SHJ solar cell that is structured similar to and as described.

In another aspect, the methods may include reducing the thickness of TCO layers by about 200% to 300% and depositing hydrogenated dielectric layers on top to form double layers of antireflection coating. It has been discovered that the conductivity of a thin TCO layer can be increased through a hydrogen treatment supplied from the capping dielectric during the post deposition annealing. The optimized cells with ITO/$SiO_x$:H stacks achieved more than 41 mA/cm$^2$ generation current on 120-micron-thick wafers while having approximately 100 Ohm/square sheet resistance. Further, the solar cells and methods disclosed herein may include integration of ITO/$SiO_x$:H stacks with Cu plating and use ITO/$SiN_x$/$SiO_x$ triple layer antireflection coatings. The experimental data described in detail below shows the improved optics and resistance in cell stacks with varying materials and thicknesses.

The disclosed systems and methods may be easily incorporated into the production of Si heterojunction solar cells, thereby enhancing the operational performance of the solar cell.

EXAMPLES

The following Examples are provided in order to demonstrate and further illustrate certain embodiments and aspects of the present disclosure and are not to be construed as limiting the scope of the disclosure.

Example 1

The following section details the results and protocol undertaken to enhance the conductivity and improve the optical response in Si heterojunction solar cells through the use of a second hydrogenated Si oxide antireflective coating layer capping the first transparent conducting oxide antireflective coating layer. This experiment was conducted to evaluate the combined effects of varying the thicknesses of the stack layers while using hydrogenated Si oxide antireflective coating layers to increase the conductivity of the adjacent transparent conducting oxide antireflective coating layer.

The starting ITO films may have a thickness of about 30-50 nm and a relatively high oxygen content with very low carrier density. Previously, such films with 150-200 nm thickness would be used at the rear side of the cell as IR mirrors. The experimental results confirm that the conductivity of these films is increased after $SiO_x$:H deposition and annealing. This approach may achieve around 41-41.3 mA/cm$^2$ generation current ($J_{gen}$) on 120 μm thick double side textured wafer or base layer, while keeping the sheet resistance (R□) of the front ITO film equal to 100 Ω/□.

In this experiment, SHJ cells with metal electrodes deposited on ITO were coated with a PECVD $SiO_x$:H film. Although not preventing probing the cells, this approach may make soldering Cu ribbons to the busbars challenging. To overcome these potential challenges, an additional patterning process may be used in a solar cell with an ITO/$SiO_x$:H stack in order to form a front metal grid. In a non-limiting example method for producing one of the disclosed SHJ solar cell arrangements, $SiO_x$:H layers may be patterned by the lift off of the screen printed resist and Cu may be plated in the openings by light induced plating.

To optimize ITO/$SiO_x$:H stacks, $J_{gen}$ and R□ were measured on complete SHJ solar cells. SHJ cells with the junction on the front side were used. Therefore sheet conductivity between metal fingers on the front was only due to the ITO film. SHJ cells were made on n-type CZ wafers with 3-4 Ω-cm resistivity. The thickness of the wafers after texturing was approximately 120 μm. Amorphous Si films were deposited on both sides of the wafers followed by ITO sputtering and sputtering of the rear Ag contact. A front metal grid was formed either by screen printing of Ag paste to make 10×10 $cm^2$ cells or by photolithographic patterning of the sputtered Ag film to make 1×4 cm2 cells. Screen printed cells had three 1 mm wide busbars and approximately 100-μm-wide fingers. Photolithographically patterned cells had 20 μm wide fingers and featured a busbar around the perimeter of the cell defining its area. Finally, the cells were capped with dielectric layers and annealed in a muffle furnace at 200° C. for 30 minutes.

The ITO films were reactively sputtered at room temperature using a MRC 944 tool with a DC power supply. An ITO target with 90/10 $In_2O_3/SnO_2$ ratio was used. The oxygen flow and deposition pressure were varied during sputtering. The a-Si and $SiO_x$:H layers were deposited using a Applied Materials P-5000 PECVD tool. The $SiO_x$:H layers were previously measured by RBS to have approximately 25% hydrogen by the number of atoms. The thicknesses of $SiO_x$:H and ITO layers were measured using a Woollam M-2000 ellipsometer. The optical modelling was done using Opal 2 and Ray Tracer software developed by PVLightHouse. In simulations, the optical constants of the hydrogenated ITO and $SiO_x$:H layers measured by ellipsometry were used. The results of the modelling suggested that the optimum combination of ITO and $SiO_x$:H was about 40-50 nm and 90-110 nm, respectively. These optimum thicknesses were based on a minimum conductivity of the ITO layer as required by the particular grid design. To measure the solar cell performance IV curves (through scanning an applied voltage across the cells and obtaining the current response) of the cells were determined on a flash IV tester from Sinton Instruments using an NREL certified cell as a reference.

Results and Discussion 3.1. EQE and R□ of SHJ Cells with ITO/$SiO_x$:H Stacks FIGS. 2-3 show the experimental results of R□ and $J_{gen}$ as a function of oxygen flow and sputtering pressure varied during ITO sputtering for the font emitter SHJ cells having an 80 nm ITO layer and 50 nm ITO/100 nm $SiO_x$:H stacks.

Figure 2:
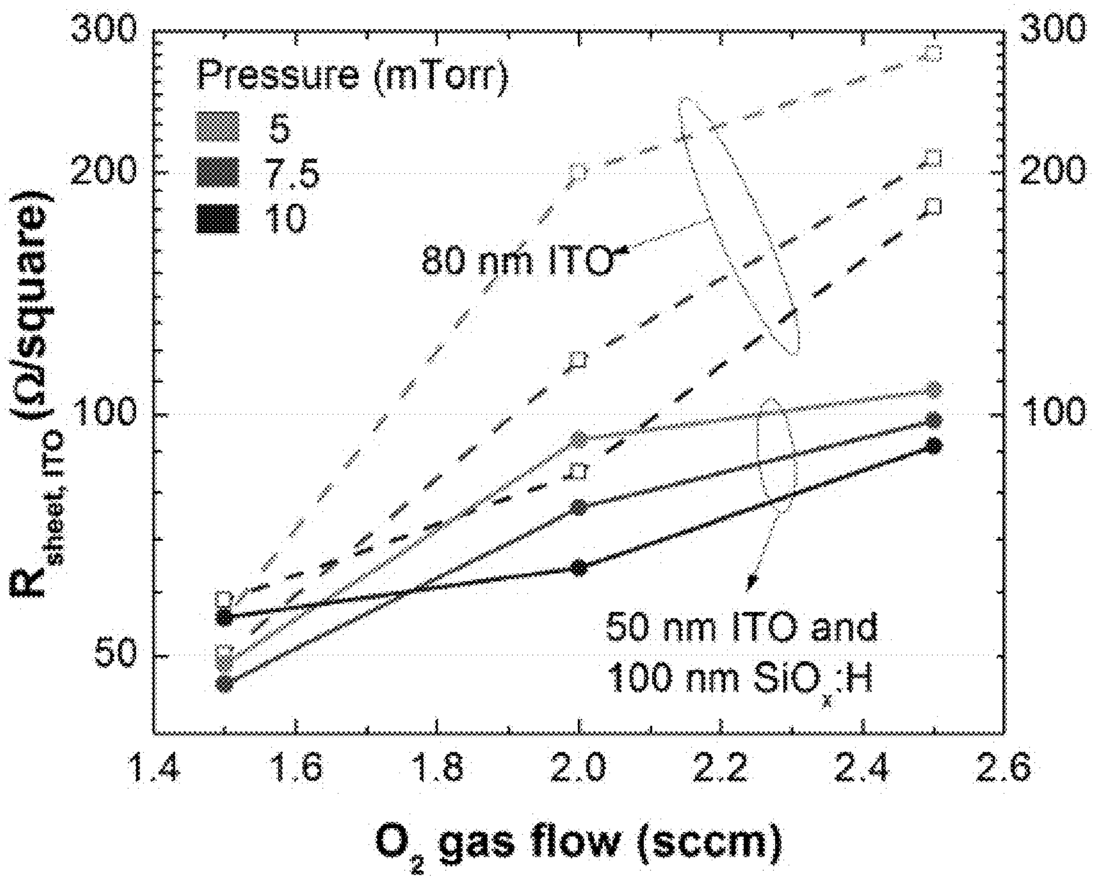
FIG. 2 is a graph showing experimental results for sheet resistance as a function of oxygen flow and sputtering pressure across three different cell stack arrangements, in accordance with the present disclosure.

FIG. 2 compares the R□ measured on the p-side-up SHJ solar cells having a 80 nm ITO layer with the R□ measured on the cells having a 50 nm ITO/100 nm $SiO_x$:H stack on the front side. On the rear side, the cells had a thick-ITO/Ag stack optimized to work as an IR mirror. The results show that capping an ITO layer with a layer of $SiO_x$:H can increase the conductivity of the TCO layer 2-5 times, depending on the initial oxygen content in the ITO layer and the sputtering pressure at deposition. The same results were observed when the ITO layer was capped by $SiN_x$:H and a-Si:H layers. These results further advance and are in agreement with the data obtained by Ritzau et al., for the films doped from underlying a-Si:H films. An increase in ITO conductivity of about 20-40% was observed after annealing when the ITO layer is sputtered on a-Si:H films versus being sputtered on glass or crystalline silicon.

Figure 3:
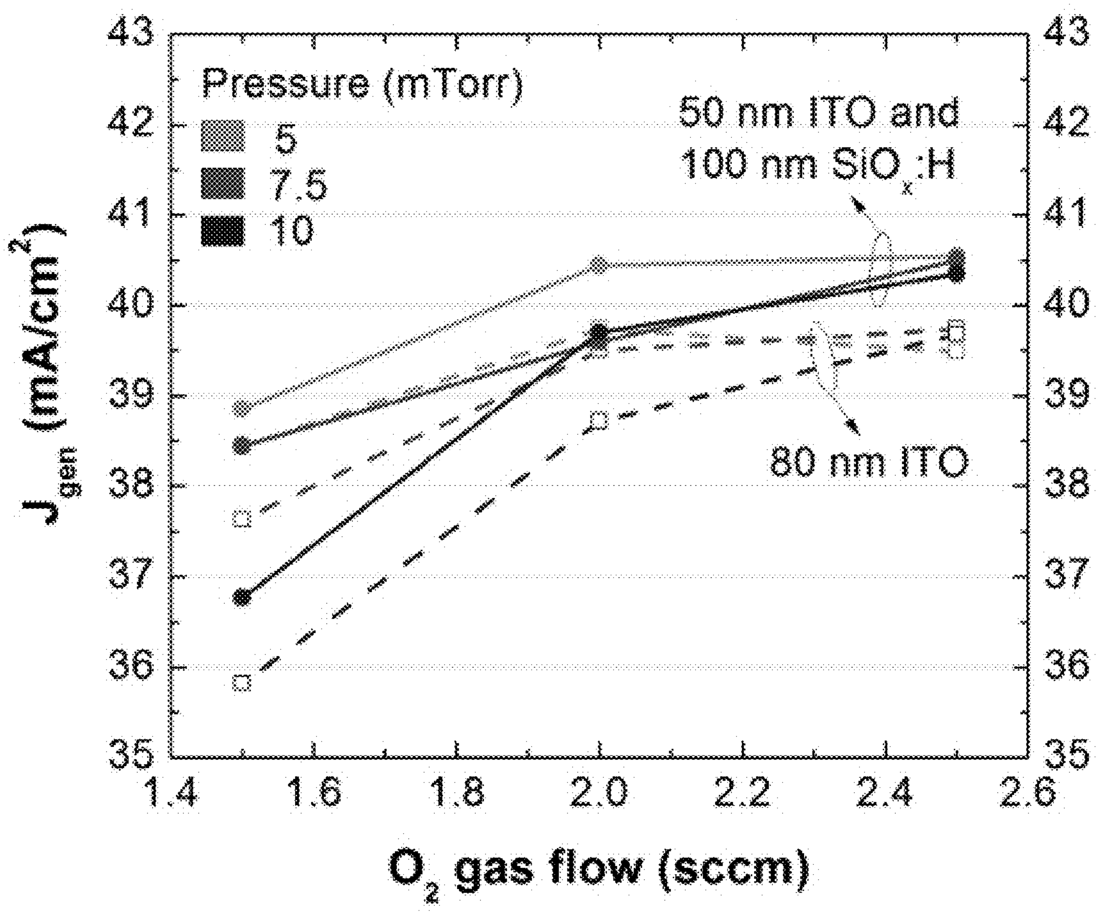
FIG. 3 is a graph showing experimental results for generation current as a function of oxygen flow and sputtering pressure across three different cell stack arrangements, in accordance with the present disclosure.

FIG. 3 shows the resulting $J_{gen}$ as measured on the p-side-up SHJ cells prepared for this experiment. The 50 nm ITO layers that were capped with $SiO_x$:H demonstrated a superior optical performance when sputtered with a high oxygen dilution. The cells with the optimum ITO layer, such as those sputtered at 5 mTorr pressure and 2 sccm $O_2$ flow, for example, achieved a 40.5 mA/$cm^2$ $J_{gen}$ and about 90-100 Ohm/□ R□. This result is approximately 1 mA/$cm^2$ higher than the $J_{gen}$ of the cells with a single optimized 80 nm ITO layer, with almost no loss in sheet resistance. Such R□ is sufficient for use with most front grid designs with an acceptable series resistance loss.

Similar performance may be achieved by using a low oxygen ITO film with about 50 Ω/□ R□ at 80 nm thick, capped with a low index dielectric not containing hydrogen, such as thermally evaporated MgO or RF sputtered $SiO_x$, for example. In this arrangement, the ITO layer is not excessively doped by hydrogen and can provide the necessary transparency. The effect of the hydrogen treatment on the material properties of the ITO layer may guide the design of ITO/dielectric stacks.

Example 2

Further improvement of the optical response of SHJ cells is possible through reducing parasitic IR absorption at the rear side of the cell. In this experiment, a conventional 200 nm ITO/Ag stack was replaced with a 20 nm ITO/200 nm $SiO_x$:H/Ag stack. For making a good contact with Ag, $SiO_x$:H was immersed in HF solution prior to Ag sputtering. Without being bound by theory, it is theorized that this process created local openings in the PECVD $SiO_x$:H due to its porous structure, enabling the $SiO_x$:H to make good contact with the sputtered Ag for EQE measurement. Thus, the EQE data represents mostly the ITO/$SiO_x$:H/Ag cell stack structure with some fraction of ITO/Ag. Note that such structures were prepared only for optical measurements and no solar cells were fabricated using this process flow. Alternatively, a better patterning method could produce functional solar cells with ITO/$SiO_x$:H/Ag stacks at the rear side.

3.2. Simulation of SHJ Cells with ITO/$SiN_x$/$SiO_x$ Stacks.

Figure 4:
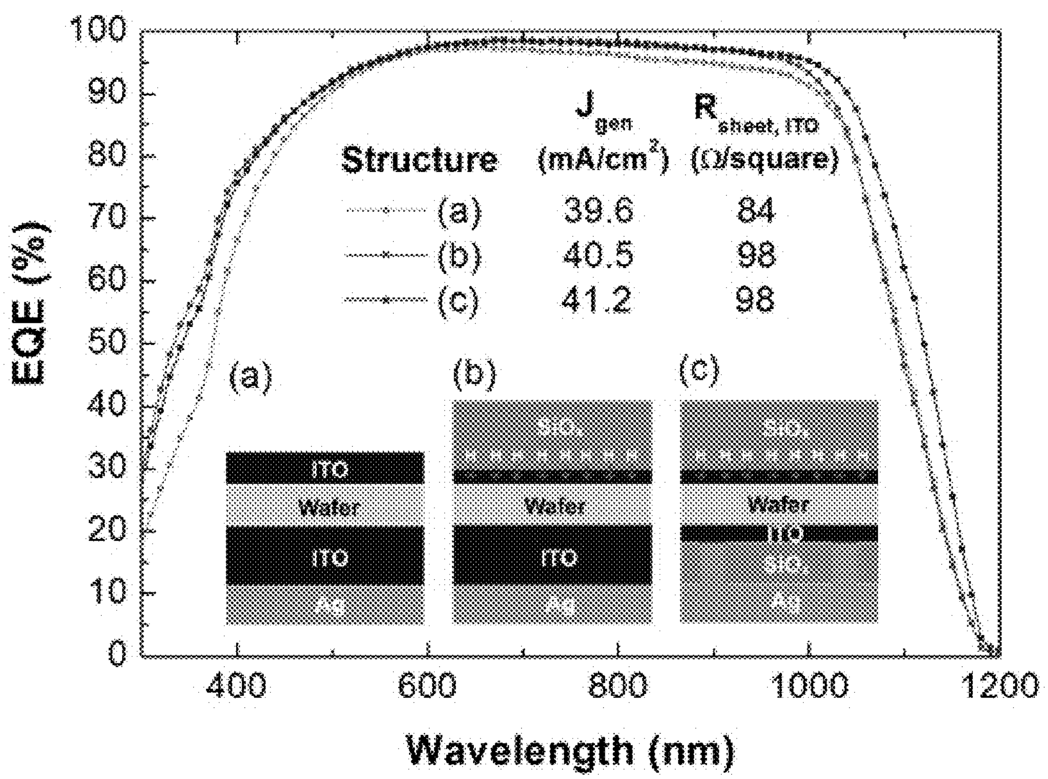
FIG. 4 is a graph showing experimental results for external quantum efficiencies as a function of wavelength across three different cell stack arrangements, in accordance with the present disclosure.

FIG. 4 shows the results of the EQE with respect to wavelength of p-side-up SHJ cells across three different optical structures.

FIG. 4 compares the measured EQE of a conventional SHJ cell with the EQE of the cells having ITO/$SiO_x$:H stacks on the front as well as cells having ITO/$SiO_x$:H stacks on both the front and rear sides. The results show that a thinner ITO layer together with a lower reflectance double layer of antireflection coating allows for a better response in the 300-500 nm and 700-1050 nm wavelength ranges. Moreover, improving the rear IR mirror allowed for a better IR response in the 1000-1200 nm range, which added another 0.7 mA/$cm^2$ to the overall $J_{gen}$. Interestingly, improving a rear mirror in this experiment yielded equivalent results to using a thicker wafer. For example, SHJ cells with a 20 nm ITO/$SiO_x$ rear mirror made on a 120 μm wafer had a similar IR performance (~60-70% EQE at 1100 nm) as compared to a 190 μm cell having a conventional 200 nm ITO/Ag stack.

For some cell designs, optical losses may be further reduced by using even thinner ITO layers. For example, in the cells with 10 μm fingers, the spacing between the fingers may be less than 1 mm, which allows for the use of TCOs with about 200-300 Ω/□ R□. Such fingers may be produced, for example, by laser patterning and Cu plating. As another example of further loss reduction, in cells with a rear emitter, lateral conductivity between the fingers is increased by the conductivity of the bulk of the wafer. In SHJ cells at a maximum power point operation, the bulk can have about $1\times10^{15}$ $cm^{-3}$ to about $3\times10^{15}$ $cm^{-3}$ excess carrier density, which provides approximately 100-300 Ω/□ lateral conductivity in 120 μm wafers.

Thus, the thickness of the ITO layers can be reduced even more, down to about 10-20 nm. The limit for the thickness reduction may depend on the interaction between the metal grid and the doped a-Si layer, as well as other considerations, such as metal contact adhesion and reliability, for example. In an alternative extreme design, the TCO layer can be eliminated altogether and completely excluded from optical losses.

Figure 5:
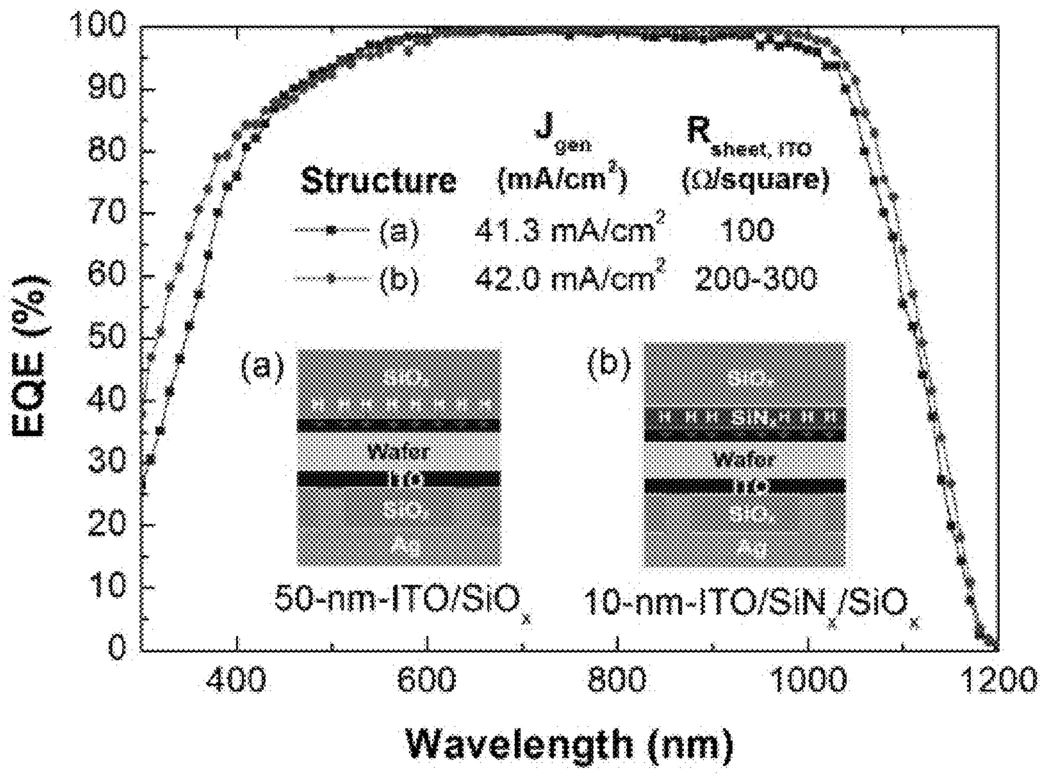
FIG. 5 is a graph showing experimental results for external quantum efficiencies as a function of wavelength across two different cell stack arrangements, in accordance with the present disclosure.

However, to achieve the desired antireflective properties, in addition to $SiO_x$, cells with very thin (<50 nm) ITO layers may use dielectrics with higher index, such as a transparent low temperature $SiN_x$, for example. FIG. 5 is a graph showing the simulated EQE results with respect to wavelength for p-side-up SHJ cells and compares the optical response in 50 nm ITO/$SiO_x$ and 20 nm ITO/$SiN_x$/$SiO_x$ cell stack structures. FIG. 5 shows the simulated EQE curves for the cell structures with 10 nm ITO/$SiN_x$/$SiO_x$ stacks. The simulation suggests that the $J_{gen}$ of such structures may reach 42 mA/$cm^2$.

3.3. Solar Cell Performance

Table I below summarizes the performance of the best SHJ solar cells with ITO/$SiO_x$:H stacks on the front side. The only observed effects on cell performance when capping the ITO layer with the $SiO_x$:H layer were the sheet resistance reduction and the improved optical response discussed above. The full potential of the stack was realized in 1×4 $cm^2$ cells having 20 μm fingers patterned photolithographically. The front grid shading in these cells comprised approximately 2%, allowing a $J_{SC}$ greater than 40 mA/$cm^2$. Note also that these cells had optimized a-Si layers on the front side allowing for a better response in the visible range. The rear side of the cells had a conventional 200 nm ITO/Ag stack.

TABLE I

The parameters for the record SHJ cells, which were using ITO/$SiO_x$ stacks.

| Cell type | $V_{oc}$ (mV) | $J_{gen}$ (mA/$cm^2$) | $J_{sc}$ (mA/$cm^2$) | pFF (%) | FF (%) | η (%) |
|---|---|---|---|---|---|---|
| 10 × 10 $cm^2$, screen printing | 727 | 40.6 | 37.9 | 81.6 | 78.2 | 21.5[1] |
| 1 × 4 $cm^2$ photolith., floating busbar | 739 | 41.3 | 40.6 | 82.0 | 78.0 | 23.4[2] |

[1]confirmed at NREL,
[2]in-house measurement 3.4. Integration with Cu Plating

Solar cells with a $SiO_x$:H layer deposited after the formation of the front metal grid could make soldering the cells problematic. The process flow described below resolves this issue by using $SiO_x$ as a mask for Cu plating. To pattern $SiO_x$, a resist grid was screen printed on the ITO layer and followed by the deposition of $SiO_x$ on top of the resist. Next, the resist was lifted using an alkaline solution to make openings in the dielectric. Thus, a dielectric mask for Cu plating was formed. With this method, for example, Ni/Cu/Sn could be plated in the openings using light- or field-induced plating. In this experiment, an alternative seeding method was used, which allowed direct Cu/Sn plating on the ITO layer with superior adhesion. The cells processed this way, achieved 20% efficiency on 153 $cm^2$ area with 729 mV $V_{OC}$, 36.1 mA/$cm^2$ $J_{SC}$ and 75.9% FF. Thus, presently disclosed are new methods to improve optical response of SHJ cells and to integrate these stacks with Cu plating.

Thus, the present disclosure provides systems and methods for improving the optical response of SHJ cells using ITO/$SiO_x$:H stacks and integrating these stacks with Cu plating. Further, conductivity of the sputtered ITO films may be increased by treating the transparent conducting oxide films with hydrogen supplied from PECVD dielectrics. Additionally, SHJ cells with optimized ITO/$SiO_x$ stacks on both sides of the base layer in the solar cell produced about 41 mA/$cm^2$ $J_{gen}$ with 100 Ω/□ sheet resistance and some structures achieved 41.3 mA/$cm^2$. Using transparent conducting oxide antireflective coating layers capped with hydrogenated dielectric layers in ITO/$SiN_x$/$SiO_x$ stacks with advanced cell designs allowing 300 Ω/□ sheet resistances can further increase $J_{gen}$ to around 42 mA/$cm^2$. While the mechanism for increasing conductivity in the antireflective coating layers of transparent conducting oxide capped with hydrogenated dielectrics may not be fully understood, the data suggests that further reducing the thickness of the transparent conducting oxide antireflective coating layers may aid in fully realizing the potential of ITO/$SiO_x$:H stacks.

INDUSTRIAL APPLICABILITY

Devices and methods for reducing optical losses in transparent conductive oxides (TCOs) used in silicon heterojunction (SHJ) solar cells has been provided. Thus, improved optics and resistance in cell stacks result in improved generation current and more economically useful silicon heterojunction (SHJ) solar cells.

Numerous modifications to the present invention will be apparent to those skilled in the art in view of the foregoing description. Accordingly, this description is to be construed as illustrative only and is presented for the purpose of enabling those skilled in the art to make and use the invention and to teach the best mode of carrying out same. The exclusive rights to all modifications which come within the scope of the appended claims are reserved.

What is claimed is:

1. A method for fabricating a solar cell, comprising:

(a) preparing a silicon (Si) base layer;

(b) depositing an emitter layer on a first surface of the Si base layer, wherein the emitter layer comprises an amorphous silicon;

(c) depositing a first antireflective coating layer on the emitter layer, wherein the first antireflective coating layer comprises a transparent conducting oxide, wherein the transparent conducting oxide comprises indium tin oxide, GaInO, GaInSnO, ZnInO, and/or ZnInSnO;

(d) depositing a second antireflective coating layer on the first antireflective coating layer, wherein the second antireflective coating layer comprises a hydrogenated silicon oxide; and (e) annealing the solar cell such that the first antireflective coating layer is hydrogenated by the second antireflective coating layer thereby increasing conductivity of the first antireflective coating layer.

2. The method of claim 1, wherein conductivity of the first antireflective coating layer is increased by about 20% to about 40%.

3. The method of claim 1, wherein the second antireflective coating layer has an atomic percentage of hydrogen between about 10% and about 40%.

4. The method of claim 3, wherein the atomic percentage of hydrogen is about 25%.

5. The method of claim 1, further comprising:
depositing a conducting grid on the second antireflective coating layer.

6. The method of claim 5, wherein the conducting grid comprises at least one of silver, copper, and nickel.

7. The method of claim 1, wherein the silicon base layer includes a crystalline-silicon substrate.

8. The method of claim 1, wherein the silicon base layer includes an epitaxially formed crystalline-silicon thin film.

9. A method for fabricating a solar cell, comprising:
(a) preparing a silicon (Si) base layer;
(b) depositing an emitter layer on a first surface of the Si base layer, wherein the emitter layer comprises an amorphous silicon;
(c) depositing a first antireflective coating layer on the emitter layer, wherein the first antireflective coating layer comprises a transparent conducting oxide;
(d) depositing a second antireflective coating layer on the first antireflective coating layer, wherein the second antireflective coating layer comprises a hydrogenated silicon oxide; and
(e) annealing the solar cell such that the first antireflective coating layer is hydrogenated by the second antireflective coating layer thereby increasing conductivity of the first antireflective coating layer.

10. The method of claim 9, wherein the transparent conducting oxide comprises an indium oxide.

* * * * *